(12) United States Patent
Meade

(10) Patent No.: US 9,135,992 B2
(45) Date of Patent: Sep. 15, 2015

(54) METHODS FOR FORMING MEMORY DEVICES WITH REDUCED OPERATIONAL ENERGY IN PHASE CHANGE MATERIAL

(75) Inventor: Roy E. Meade, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 826 days.

(21) Appl. No.: 13/236,178

(22) Filed: Sep. 19, 2011

(65) Prior Publication Data

US 2012/0002465 A1 Jan. 5, 2012

Related U.S. Application Data

(62) Division of application No. 12/480,041, filed on Jun. 8, 2009, now Pat. No. 8,031,518.

(51) Int. Cl.
| | |
|---|---|
| *G11C 11/00* | (2006.01) |
| *H01L 45/00* | (2006.01) |
| *H01L 21/8239* | (2006.01) |
| *G11C 13/00* | (2006.01) |
| *G11C 7/04* | (2006.01) |

(52) U.S. Cl.
CPC ........ *G11C 13/0004* (2013.01); *G11C 13/0069* (2013.01); *H01L 45/06* (2013.01); *H01L 45/12* (2013.01); *H01L 45/126* (2013.01); *H01L 45/144* (2013.01); *G11C 7/04* (2013.01); *G11C 2013/0095* (2013.01)

(58) Field of Classification Search
CPC .................................................. H01L 45/1641
See application file for complete search history.

(56) References Cited

U.S. PATENT DOCUMENTS

| | | | |
|---|---|---|---|
| 4,586,164 A * | 4/1986 | Eden | ............................ 365/127 |
| 6,150,253 A | 11/2000 | Doan et al. | |
| 6,294,452 B1 | 9/2001 | Doan et al. | |
| 7,050,328 B2 | 5/2006 | Khouri et al. | |
| 7,057,923 B2 | 6/2006 | Furkay et al. | |
| 7,130,214 B2 | 10/2006 | Lee | |
| 7,394,089 B2 | 7/2008 | Doyle et al. | |

(Continued)

FOREIGN PATENT DOCUMENTS

JP 20060120810 A 5/2006

OTHER PUBLICATIONS

US Patent and Trademark Office Patent Trial and Appeal Board Decision on Appeal in U.S. Appl. No. 12/243,809 to Breitwisch et al., Apr. 21, 2014.*

(Continued)

*Primary Examiner* — Matthew W Such
*Assistant Examiner* — Robert Carpenter
(74) *Attorney, Agent, or Firm* — TraskBritt

(57) ABSTRACT

Methods of forming and operating phase change memory devices include adjusting an activation energy barrier between a metastable phase and a stable phase of a phase change material in a memory cell. In some embodiments, the activation energy barrier is adjusted by applying stress to the phase change material in the memory cell. Memory devices include a phase change memory cell and a material, structure, or device for applying stress to the phase change material in the memory cell. In some embodiments, a piezoelectric device may be used to apply stress to the phase change material. In additional embodiments, a material having a thermal expansion coefficient greater than that of the phase change material may be positioned to apply stress to the phase change material.

12 Claims, 3 Drawing Sheets

(56) References Cited

U.S. PATENT DOCUMENTS

| | | | |
|---|---|---|---|
| 7,463,512 | B2 | 12/2008 | Lung |
| 7,482,615 | B2 | 1/2009 | Zhu |
| 7,667,222 | B2 | 2/2010 | Iwasaki |
| 7,848,135 | B2 * | 12/2010 | Elmegreen et al. ............ 365/157 |
| 2005/0041464 | A1 | 2/2005 | Cho et al. |
| 2006/0006471 | A1 * | 1/2006 | Rossel et al. ................. 257/358 |
| 2006/0034116 | A1 | 2/2006 | Lam et al. |
| 2006/0087921 | A1 * | 4/2006 | Iwasaki ..................... 369/13.01 |
| 2006/0138393 | A1 | 6/2006 | Seo et al. |
| 2006/0152186 | A1 | 7/2006 | Suh et al. |
| 2007/0159868 | A1 | 7/2007 | Sugita et al. |
| 2007/0249086 | A1 * | 10/2007 | Philipp et al. .................. 438/95 |
| 2008/0197333 | A1 | 8/2008 | Lung |
| 2009/0010048 | A1 | 1/2009 | Fuji |
| 2009/0029031 | A1 | 1/2009 | Lowrey |
| 2010/0078621 | A1 | 4/2010 | Breitwisch et al. |

OTHER PUBLICATIONS

Bertotti et al., "Hysteresis in Piezoelectric and Ferroelectric Materials," 2005, The Science of Hysteresis, vol. 3, Chapter 4, Elsevier, pp. 337-465.

Coefficient of Thermal Expansion, Wikipedia, Dec. 7, 2008, http://en.wikipedia.org/wiki/Coefficient_of_thermal_expansion, 6 pages.

Friedrich et al., Structural Transformations of Ge2Sb2Te5 Films Studied by Electrical Resistance Measurements, Journal of Applied Physics, vol. 87, No. 9, May 1, 2001, pp. 4130-4134.

English translation of JP2006120810 A, May 26, 2011, pp. 1-10.

Johnson et al., Effects of Pressure on the Electrical Conductivity of Chalcogenide Glasses, Journal of Non-Crystalline Solids, vol. 28, pp. 273-291 (1978).

Johnson et al., High-Pressure Effects on Electrical Switching IN As50Te4515 Semiconducting Glass, Journal of Non-Crystalline Solids, vol. 28, pp. 369-373 (1978).

Karpov et al., Temporal Changes of Parameters in Phase Change Memory, VLSI, 2008, 2 pages.

Lu et al., Microstructural Measurements of Amorphous GeTe Crystallization by Hot-Stage Optical Microscopy, J. Appl. Phys. vol. 77, No. 2, Jan. 15, 1995, pp. 517-521.

Numonyx, The Basics of Phase Change Memory (PCM) Technology (2007-2008), 4 pages.

Park et al., Thermomechanical Properties and Mechanical Stresses of Ge2Sb2Te5 Films in Phyase-Change Random Access Memory, Thin Solid Films, vol. 517, pp. 848-852 (2008).

Parthasarathy et al., Effect of High Pressure on Chalcogenide Glasses, Bull. Mater. Sci., vol. 7, Nos. 3 & 4, Oct. 1985, pp. 271-302.

Russo et al., Modeling of Programming Read Performance in Phase-Change Memories—Part I: Cell Optimization and Scaling, IEEE Transactions on Electron Devices, vol. 55, No. 2, Feb. 2008, pp. 506-514.

Wang et al., Effects of High Pressure on the Nucleation of Cu60Zr20Hf10Ti10 Bulk Metallic Glass, Journal of Alloys and Compounds, vol. 388, pp. 262-265 (2005).

Wu et al., "Pressure Effect on Vapor-Deposited Amorphous Materials," Journal of Non-Crystalline Solids 18, p. 21-28 (1975).

* cited by examiner

METHODS FOR FORMING MEMORY DEVICES WITH REDUCED OPERATIONAL ENERGY IN PHASE CHANGE MATERIAL

CROSS-REFERENCE TO RELATED APPLICATION

This application is a divisional of U.S. patent application Ser. No. 12/480,041, filed Jun. 8, 2009, now U.S. Pat. No. 8,031,518 issued Oct. 4, 2011, the disclosure of which is hereby incorporated herein by this reference in its entirety.

TECHNICAL FIELD

Embodiments of the present invention relate to methods, structures, and devices for reducing the energy required to perform a writing operation, a reset operation, or both a writing operation and a reset operation in phase change memory devices.

BACKGROUND

Various types of non-volatile memory devices employ materials that can be selectively caused to exhibit more than one value of electrical resistivity. To form a single memory cell (i.e., one bit), a volume of such a material may be provided between two electrodes. A selected voltage (or current) may be applied between the electrodes, and the resulting electrical current (or voltage) therebetween will be at least partially a function of the particular value of the electrical resistivity exhibited by the material between the electrodes. A higher electrical resistivity may be used to represent a "1" in binary code, and a lower electrical resistivity may be used to represent a "0" in binary code, or vice versa. By selectively causing the material between the electrodes to exhibit higher and lower values of electrical resistivity, the memory cell can be selectively characterized as exhibiting either a 1 or a 0 value.

One particular type of such non-volatile variable resistance memory devices is the phase change memory device. In a phase change memory device, the materials provided between the electrodes typically are capable of exhibiting at least two microstructural phases or states, each of which exhibits a different value of electrical resistivity. For example, the so-called "phase change material" may be capable of existing in a crystalline phase (i.e., the atoms of the material exhibit relatively long range order) and an amorphous phase (i.e., the atoms of the material do not exhibit any or relatively little long range order). Typically, the amorphous phase is formed by heating at least a portion of the phase change material to a temperature above the melting point thereof, and then allowing the phase change material to rapidly cool, which results in the material solidifying before the atoms thereof can assume any long range order. To transform the phase change material from the amorphous phase to a crystalline phase, the phase change material is typically heated to an elevated temperature below the melting point, but above a crystallization temperature, for a time sufficient to allow the atoms of the material to assume the relatively long range order associated with the crystalline phase.

For example, $Ge_2Sb_2Te_5$ (often referred to as "GST") is often used as a phase change material. This material has a melting point of about 620° C., and is capable of existing in amorphous and crystalline states. To form the amorphous (high resistivity) phase, a portion of the material is heated to a temperature above the melting point thereof by passing a current through the material between the electrodes and heating the material (the heat being generated due to the electrical resistance of the phase change material) for as little as 10 to 100 nanoseconds. As the GST material quickly cools when the current is interrupted, the atoms of the GST do not have sufficient time to form an ordered crystalline state, and the amorphous phase of the GST material is formed. To form the crystalline (low resistivity) phase, a portion of the material may be heated to a temperature of about 550° C., which is above the crystallization temperature and near, but below, the melting point of the GST material, by passing a lower current (lower than the current used in forming the amorphous phase, as described above) through the GST material between the electrodes to heat the GST material (to a temperature above the crystallization temperature but below the melting point) for an amount of time (e.g., as little as about 30 nanoseconds) to allow the atoms of the GST material to assume the long range order associated with the crystalline phase, after which the current flowing through the material may be interrupted. One of the melting current (the current passed through the phase change material to form the amorphous phase) and the crystallization current (the current passed through the phase change material to form the crystalline phase) may be referred to as the "write current," and the other of the melting current and the crystallization current may be referred to as the "reset current." The write current and the reset current may be collectively referred to as the "programming currents."

Various memory devices having memory cells comprising variable resistance material, as well as methods of forming and using such memory devices are known in the art. For example, memory cells comprising variable resistance materials and methods of forming such memory cells are disclosed in U.S. Pat. No. 6,150,253 to Doan et al. (issued Nov. 21, 2000), U.S. Pat. No. 6,294,452 to Doan et al. (issued Sep. 25, 2001), United States Patent Application Publication No. 2006/0034116 A1 to Lam et al. (published Feb. 16, 2006), U.S. Pat. No. 7,057,923 to Furkay et al. (issued Jun. 6, 2006), United States Patent Application Publication No. 2006/0138393 A1 to Seo et al. (published Jun. 29, 2006), and Unites Stated Patent Application Publication No. 2006/0152186 A1 to Suh et al. (published Jul. 13, 2006). Furthermore, supporting circuitry that may be used to form a memory device comprising memory cells having a variable resistance material, as well as methods of operating such memory devices, are disclosed in, for example, United States Patent Application Publication No. 2005/0041464 A1 to Cho et al. (published Feb. 24, 2005), U.S. Pat. No. 7,050,328 to Khouri et al. (issued May 23, 2006), and U.S. Pat. No. 7,130,214 to Lee (issued Oct. 31, 2006).

The high amounts of energy required to heat a volume of phase change material for the programming operations (e.g., writing and reset operations) in phase change memory devices has hindered their widespread implementation in the memory device market. Thus, there is a need in the art for methods, structures, and devices for decreasing the required programming energy (i.e., current) in phase change memory devices and systems.

DETAILED DESCRIPTION

Figure 1:
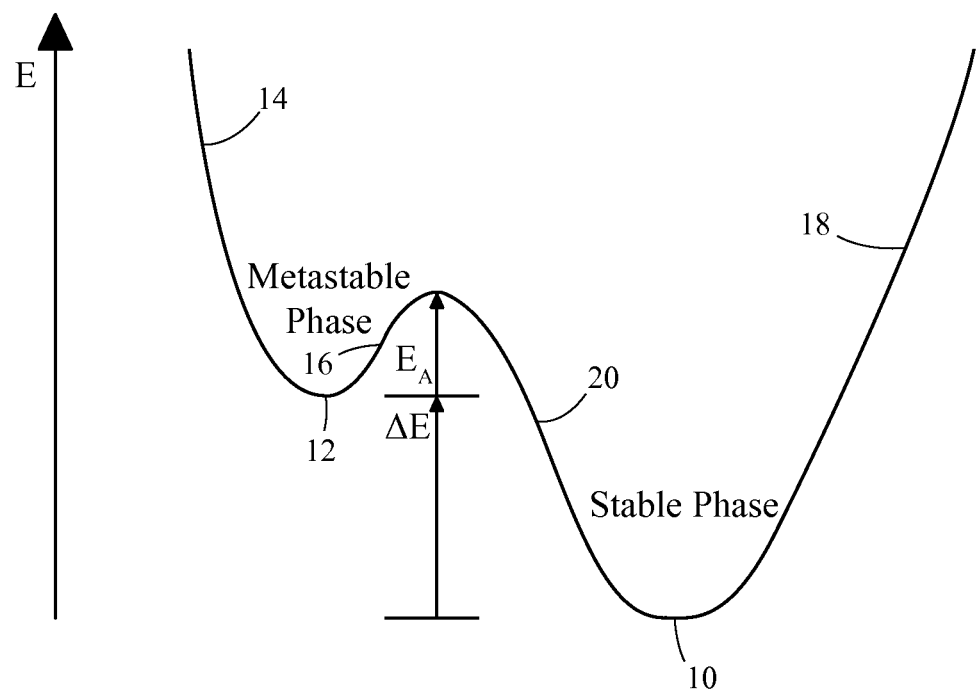
FIG. 1 is a simplified schematic diagram illustrating an example of an asymmetric quantum energy well for a hypothetical phase change material capable of existing in a stable phase and a metastable phase.

As used herein, the term "phase change material" means and includes any material that is capable of existing in two or more (e.g., 2, 3, 4, etc.) solid phases (i.e., states) exhibiting at least one different property or characteristic that can be detected, and that can be used in an electronic device to store information therein. Phase change materials include, but are not limited to, chalcogenide materials such as GeSbTe (GST), GeTe, AgInSbTe, InSe, SbSe, SbTe, InSbSe, InSbTe, GeSbSe, and GeSbTeSe.

As used herein, the term "piezoelectric material" means and includes any material that will undergo mechanical deformation in the presence of an electrical field. Piezoelectric materials have crystal structures wherein the unit cell of the crystal structure does not have a center of symmetry. By way of example, materials having perovskite or tungsten-bronze crystal structures exhibit piezoelectricity. Piezoelectric materials include, but are not limited to, quartz, gallium orthophosphate ($GaPO_4$), barium titanate ($BaTiO_3$), lead titanate ($PbTiO_3$), lead zirconate titanate (PZT) ($Pb[Zr_xTi_{1-x}]O_3$, wherein $0<x<1$), and lithium tantalate ($LiTaO_3$).

As used herein, the term "thermal expansion material" means and includes any material that may be used to stress an adjacent phase change material in an electronic device or system by way of thermal expansion mismatch resulting from a difference between the thermal expansion coefficient of the phase change material and the thermal expansion coefficient of the thermal expansion material, and a change in temperature of the phase change material and the thermal expansion material.

As used herein, the term "read operation" means an operation carried out within a memory device, in which operation a state of a memory cell is identified without changing the state of the memory cell. For example, in a memory cell capable of existing in either of two states, one representing a binary "0" and the other representing a binary "1," a read operation would be used to determine whether the memory cell was in the 0 state or the 1 state without changing the state of the memory cell.

As used herein, the term "write operation" means an operation carried out within a memory device, in which operation a state of a memory cell is changed from a default state to a non-default state. For example, in a memory cell capable of existing in either of two states, one representing a binary "0" and the other representing a binary "1," the 0 state may be designated as the default state, in which case the write operation would be used to change the state of the memory cell from the default 0 state to the non-default 1 state.

As used herein, the term "reset operation" means an operation carried out within a memory device, in which operation a state of a memory cell is changed from a non-default state to a default state. For example, in a memory cell capable of existing in either of two states, one representing a binary "0" and the other representing a binary "1," the 0 state may be designated as the default state, in which case the reset operation would be used to change the state of the memory cell from the non-default 1 state to the default 0 state.

For an improved understanding of embodiments of the invention, a brief discussion of general thermodynamic principles associated with changes between phases in a phase change material is set forth below with reference to FIG. 1. By way of example and not limitation, a volume of such phase change material, capable of exhibiting in both a solid stable phase and another solid metastable phase, may be employed in embodiments of memory devices of the present invention. The stable phase may comprise a crystalline phase (i.e., a phase exhibiting long range atomic order in crystal structure) of the phase change material, and the metastable phase may comprise an amorphous phase (i.e., a phase that does not exhibit long range atomic order in crystal structure) of the phase change material.

FIG. 1 is a simplified schematic diagram illustrating an example of an asymmetric quantum energy well for a phase change material capable of existing in a stable phase and a metastable phase. In FIG. 1, the area above the curve represents available atomic energy states in the phase change material. Although not shown in FIG. 1, a single energy state may be theoretically represented by drawing a horizontal line across a space above the curve. Lower energy states in the phase change material exist at the lower regions of the area above the curve in FIG. 1. Absent external energy input, atoms within a material tend to fall toward and occupy the lowest available atomic energy state. As shown in FIG. 1, the ground state (the lowest energy state) in the stable phase is at a relatively lower energy level (point 10 at the bottom of the stable phase energy well) relative to the energy level of the ground state (the lowest energy state) in the metastable phase (point 12 at the bottom of the metastable energy well). The metastable phase of the phase change material is bound on the left side of the figure by an energy barrier 14 and is bound on the right side of the figure by an energy barrier 16. The stable phase of the phase change material is bound on the right side of the figure by an energy barrier 18 and is bound on the left side of the figure by an energy barrier 20.

As illustrated in FIG. 1, in order for the phase change material to switch from the metastable phase to the stable phase, sufficient energy must be input into the phase change material to overcome the energy barrier 16, which is referred to herein as the activation energy $E_A$. In other words, energy (e.g., heat) must be input into the atoms of the metastable phase material to raise their energy level to a point in FIG. 1 above the energy barrier 16. The activation energy $E_A$ is the energy that is required to move from the ground state of the metastable phase into the stable phase. As also illustrated in FIG. 1, in order for the phase change material to switch from the stable phase to the metastable phase, sufficient energy must be input into the phase change material to overcome the energy barrier 20. The energy barrier 20 is equal to the sum of the difference in energy $\Delta E$ between the ground states of the metastable phase and the stable phase and the activation energy $E_A$. Thus, more energy must be input into the phase change material to switch the phase change material from the stable phase to the metastable phase than to switch the phase change material from the metastable phase to the stable phase.

By way of example and not limitation, the stable phase of the phase change material may comprise a crystalline phase exhibiting a relatively lower electrical resistance, and the metastable phase of the phase change material may comprise an amorphous phase exhibiting a relatively higher electrical resistance. Thus, as a non-limiting example, a voltage may be applied across the phase change material and the resulting current may be measured to determine whether the phase change material is in the crystalline stable phase or the metastable amorphous phase.

As known in the art, the phase change material may be selectively converted back and forth between the crystalline stable phase and the metastable amorphous phase by passing electrical current through the phase change material (and, optionally, through an adjacent resistive heating element) at a selected current magnitude and for a selected amount of time. The flow of electrical current through the phase change material (and, optionally, through an adjacent resistive heating element) generates heat due to joule heating, and the temperature to which the phase change material is heated is at least partially a function of the amount of current flowing through the phase change material (and, more particularly, a function of the current density within the phase change material). Thus, by controlling the magnitude of the current through the phase change material, the temperature to which the phase change material is heated may be controlled.

For example, to switch the phase change material from the crystalline stable phase to the amorphous metastable phase, a relatively higher electrical current may be passed through the phase change material for a relatively short amount of time, after which the current may be interrupted and the phase change material allowed to cool at a relatively rapid rate. During this process, sufficient energy is input into the phase change material to overcome the energy barrier 20 illustrated in FIG. 1. To switch the phase change material from the amorphous metastable phase to the crystalline stable phase, a relatively lower electrical current may be passed through the phase change material for a relatively longer amount of time, after which the current may be interrupted and the phase change material allowed to cool. During this process, sufficient energy is input into the phase change material to overcome the energy barrier 16 (i.e., the activation energy $E_A$) illustrated in FIG. 1. The particular values of current and time for any particular device will be at least partially a function of the material composition of the phase change material, as well as the physical dimensions of the phase change material in each memory cell of the device.

By way of example and not limitation, the crystalline stable phase may be designated as a "1" in binary logic, and the amorphous metastable phase may be designated as a "0." Furthermore, 0 may be arbitrarily designated as the default value of a memory cell in an electronic memory device. Thus, a write operation may be used to change a phase change material in a memory cell of an electronic memory device from an amorphous metastable phase to a crystalline stable phase, and, hence, to write a 1 to the memory cell. A reset operation may be used to change a phase change material in a memory cell of an electronic memory device from a crystalline stable phase to an amorphous metastable phase, and, hence, to reset the memory cell to 0. A read operation may be used to determine whether a 1 or a 0 is stored in the memory cell (i.e., whether the phase change material is in the crystalline stable phase or the amorphous metastable phase).

In accordance with embodiments of the present invention, a phase change material may be physically stressed to reduce the activation energy $E_A$ between phases of a phase change material, which may result in a lower current required to perform a reset operation, a write operation, or both a reset operation and a write operation. In other words, a force or forces may be applied to a phase change material in a memory cell of a memory device, resulting in stress within the phase change material. The stress within the phase change material may reduce the energy required to convert the phase change material between at least two phases (e.g., a solid, amorphous metastable phase and a solid, crystalline stable phase, as described herein above) in which the phase change material may exist.

Studies have been performed on the effect of pressure on the crystallization of amorphous GeTe. See Wu, C. T., Luo, H. L., "Pressure Effect on Vapor-Deposited Amorphous Materials," Journal of Non-Crystalline Solids 18, pp. 21-28 (1975). In particular, it has been observed that when a hydrostatic pressure was applied to amorphous GeTe at a rate of 500 MPa per minute to a maximum pressure of 1600 MPa, and for a duration of four minutes, approximately 5.1% of the GeTe had crystallized. In other words, the percent crystallization X was 5.1%. When the maximum pressure was increased to 1850 MPa, approximately 11.6% of the GeTe had crystallized (i.e., X was 11.6), and approximately 16.1% of the GeTe crystallized (i.e., X was 16.1) when the maximum pressure was further increased to 2000 MPA. Furthermore, it was observed that the rate at which pressure was applied also affected the degree of crystallization in the GeTe. Thus, a relationship (which may be expressed mathematically by an equation that would be different for different material systems) may be established (e.g., heuristically) between the pressure applied to a phase change material and the degree of crystallization that results after a given temperature and time at temperature. For the data given above, a plot of the pressure versus the percent crystallization (X) may be generated, and a line may be fit to the data points to generate a mathematical relationship therebetween.

A relationship also may be established (e.g., theoretically) between the activation energy $E_A$ between an amorphous phase and a crystalline phase of a phase change material and the degree of crystallization in the material for a given temperature and time at temperature. For example, Johnson-Mehl-Avrami-Kolmogorov (JMAK) crystallization theory predicts a relationship between the activation energy $E_A$ of crystallization and the degree of crystallization for a given temperature and time at temperature, which relationship is expressed by Equation 1 below:

$$E_A = -kT\ln\left(\frac{1}{k_0} \cdot \frac{1}{t-\tau} \cdot (-\ln(1-X))^{\frac{1}{n}}\right), \quad \text{Equation 1}$$

wherein k is the Boltzmann constant, T is temperature, $k_0$ is the attempt frequency factor, t is the time at temperature, i is the nucleation time, X is the percent crystallization, and n is the Avrami exponent. The variables $k_0$, $\tau$, and n in Equation 1 are material-specific variables that are known in the art for many phase change materials, or can be determined or estimated for any particular material using methods known in the art.

Thus, using relationships like those discussed above, a relationship between pressure (hydrostatic or axial) and the activation energy $E_A$ between an amorphous phase and a crystalline phase (or between other phases) of a phase change material may be identified, and the effect of any given pressure on the activation energy $E_A$ may be determined or estimated using that identified relationship. In other words, an identified mathematical relationship (identified heuristically or otherwise) between the degree of crystallization (X) and the pressure may be solved for the degree of crystallization (X) and substituted into Equation 1 above to provide a relationship between applied pressure (and, hence, stress (σ) within the phase change material) and the activation energy $E_A$.

In some embodiments of the present invention, the phase change material in memory cells of a memory device may be selectively stressed during fabrication, and the selectively applied stress may be retained therein upon completion of the fabrication process such that, when the memory device is subsequently used by an end user to store electronic data therein, the activation energy $E_A$ between phases of the phase change material is less than what it would be if the phase change material were in a relatively more relaxed state (e.g., an unstressed or a less stressed state). For example, the packaging of the memory device may be carried out under conditions in which the phase change material is stressed, and, upon completion of the packaging process, the packaging of the memory device may serve to retain the stress within the phase change material. In such embodiments, the selectively applied stress within the phase change material is a passive stress that is not intentionally changed during operation of the device.

As will be apparent to those of ordinary skill in the art, some degree of stress may be generated in previously known phase change memory devices during operation thereof due to mismatch in the coefficients of thermal expansion of the various materials in previously known devices. As used herein, the term "selectively stressed" means intentionally stressed to a level beyond that which would be attained simply due to thermal expansion mismatch in previously known devices, although the exact magnitude of the stress level may in fact be undetermined. To the Applicant's knowledge, those of ordinary skill in the art have heretofore sought to minimize such thermal expansion mismatch (and, hence, the stress resulting in the phase change material therefrom) to reduce structural damage that might occur as a result thereof. Thus, embodiments of the present invention are, surprisingly, structured and may be caused to operate in a manner that is counterintuitive to conventional approaches in the relevant art.

In additional embodiments of the present invention, the phase change material in memory cells of a memory device may be actively selectively stressed during operation of the device. In other words, the stress within the phase change material may change in an appreciable manner during operation of the device. By way of example and not limitation, the stress of the phase change material may be selectively subjected to different stress levels during operation of the device (e.g., subjected to compressive stress, subjected to tensile stress, or sequentially subjected to both compressive and tensile stress).

In some embodiments, a piezoelectric material may be used to selectively stress a phase change material in at least one memory cell of an embodiment of a memory device of the present invention. In other words, strain may be induced in a piezoelectric material disposed proximate a phase change material in a memory cell, and the strain of the piezoelectric material may be used to apply force to the phase change material. The applied force generates stress within the phase change material, and the stress within the phase change material may result in a reduction in the activation energy $E_A$, and, hence, the electrical current, required to perform a write operation, a reset operation, or both a write operation and a reset operation.

Figure 2:
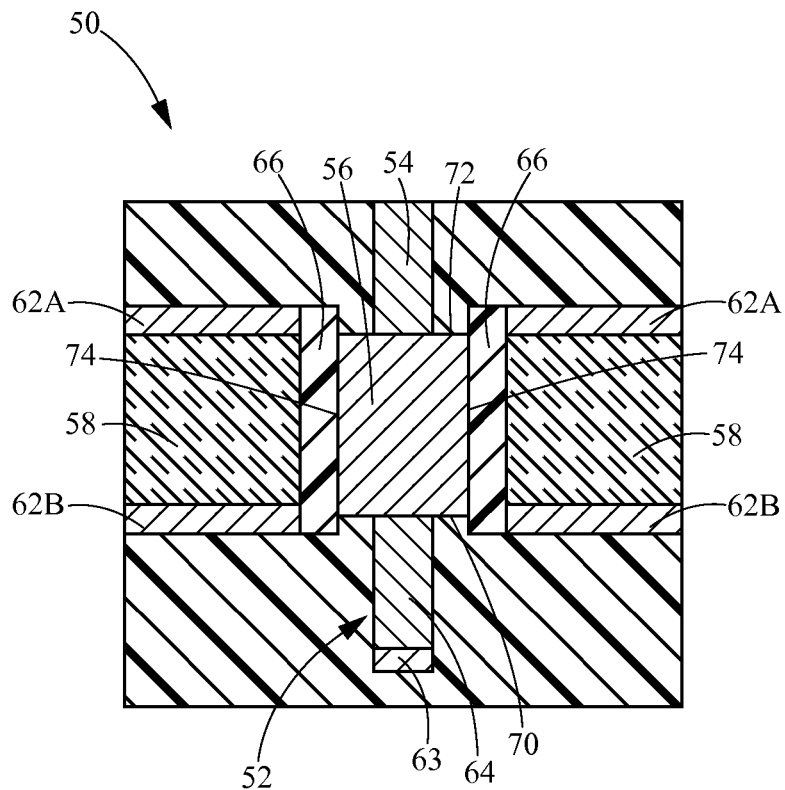
FIG. 2 is a cross-sectional view of a portion of an embodiment of a memory device of the present invention illustrating a single memory cell comprising a phase change material and a piezoelectric material for stressing the phase change material.

FIG. 2 is a cross-sectional view of a portion of an embodiment of a memory device 50 of the present invention. The memory device 50 includes an array of phase change memory cells, only one of which memory cells is illustrated in FIG. 2. Each phase change memory cell in the array includes a first electrode 52 (e.g., which may comprise the electrode commonly referred to in the art as the "bottom electrode" or "BEC"), a second electrode 54 (e.g., which may comprise the electrode commonly referred to in the art as the "top electrode" or "TEC"), and a spatially confined volume of phase change material 56 disposed between the first electrode 52 and the second electrode 54. In some embodiments, the first electrode 52 may comprise a conductive member 63 (e.g., a conductive trace or pad) in electrical contact with a resistive heating element 64 structured to generate heat as current flows through the resistive heating element 64 (and the phase change material 56) between the conductive member 63 and the second electrode 54.

The memory device 50 further includes at least one piezoelectric device that includes a piezoelectric material 58. The piezoelectric device may further include a field-generating device for providing an electrical field within the piezoelectric material 58. For example, the field-generating device may comprise a pair of electrodes 62A, 62B between which a voltage may be provided. The voltage differential between the pair of electrodes 62A, 62B may result in an electrical field in a region encompassing at least a portion of the piezoelectric material 58.

The piezoelectric material 58 may be located, and a crystalline structure of the piezoelectric material 58 may be oriented, in such a manner as to cause the piezoelectric material 58 to apply stress to the phase change material 56 when an electrical field is provided within the piezoelectric material 58 by the field-generating device (e.g., when a voltage is applied between the electrodes 62A, 62B). As a non-limiting example, the crystalline structure of the piezoelectric material 58 may be oriented such that, when an electrical field is provided within the piezoelectric material 58 by applying a voltage between the electrodes 62A, 62B, the piezoelectric material 58 expands or contracts in a direction oriented substantially parallel to a plane of the memory device 50 (i.e., the horizontal direction in the perspective of FIG. 2). The piezoelectric material 58 may also expand or contract in a direction oriented substantially perpendicular to the plane of the memory device 50. Due to the Poisson effect, if the piezoelectric material 58 expands in the horizontal direction in the perspective of FIG. 2, it will also contract in the vertical direction, and vice versa.

In some embodiments, a dielectric material 66 may be provided between the phase change material 56 and the piezoelectric material 58 to electrically insulate the phase change material 56 from the piezoelectric material 58.

As shown in FIG. 2, the volume of phase change material 56 may comprise a first end surface 70 proximate (e.g., adjacent) the first electrode 52, a second end surface 72 proximate (e.g., adjacent) the second electrode 54, and at least one lateral side surface 74 extending between the first end surface 70 and the second end surface 72. As a non-limiting example, the volume of phase change material 56 may have a rectangular (e.g., square) transverse cross-sectional shape, in which case, the volume of phase change material 56 will have four lateral side surfaces 74 extending between the first end surface 70 and the second end surface 72. As another non-limiting example, the volume of phase change material 56 may have a generally cylindrical shape (and, hence, a generally circular transverse cross-sectional shape), in which case the volume of phase change material 56 will have a single generally cylindrical lateral side surface 74 extending between the first end surface 70 and the second end surface 72.

The piezoelectric material 58 may be disposed laterally beside the phase change material 56. In some embodiments, the piezoelectric material 58 may at least partially surround the lateral side surface or surfaces 74 of the volume of phase change material 56. For example, the piezoelectric material 58 may entirely laterally surround the volume of phase change material 56. In other words, the piezoelectric material 58 may extend entirely circumferentially around the phase change material 56.

In additional embodiment of the present invention, the field-generating device (e.g., the electrodes 62A, 62B) may be disposed remote from the piezoelectric material 58. For example, the field-generating device may be disposed remote from the piezoelectric material 58 within the memory device 50, or it may even be disposed outside the memory device 50 (e.g., as a separate device used in conjunction with the memory device 50).

When using the memory device 50, the field-generating device may be used to selectively apply an electrical field within the piezoelectric material 58 and cause the piezoelectric material 58 to expand and/or contract in such a manner as to selectively apply stress to the phase change material 56. Thus, for example, as the voltage, and the polarity of the voltage, between the electrodes 62A, 62B is selectively controlled, the phase change material 56 may be selectively stressed, and, hence, the activation energy $E_A$ between phases of the phase change material 56 may be selectively adjusted (e.g., controlled).

The strain ($\in$) resulting in the piezoelectric material 58 and in the phase change material 56 may be used to estimate the magnitude of the stress a within the piezoelectric material 58 and in the phase change material 56 using the equation $\sigma = E\in$, wherein E is the elastic (Young's) modulus, and $\in$ is the strain in a body of material. Thus, the stress $\sigma$ within the phase change material 56 will be a function of a number of variables including the strain $\in$ that can be generated in the piezoelectric material 58 and the phase change material 56 by the applied electrical field, and the elastic moduli E of the phase change material 56 and the piezoelectric material 58. Thus, the piezoelectric material 58 may be used to selectively stress the phase change material 56 and alter an activation energy $E_A$ barrier between phases of the phase change material 56 in a desirable manner.

Methods other than those employing piezoelectric materials may be used to selectively stress a phase change material in a memory cell to an extent sufficient to cause an appreciable reduction (e.g., a reduction of about 0.05 electron volt (eV) or more) in the activation energy $E_A$ (FIG. 1) between phases of the phase change material in accordance with additional embodiments of the invention. By way of example and not limitation, principles of thermal expansion mismatch may be used to selectively stress a phase change material in a memory cell, as described in further detail below.

Figure 3:
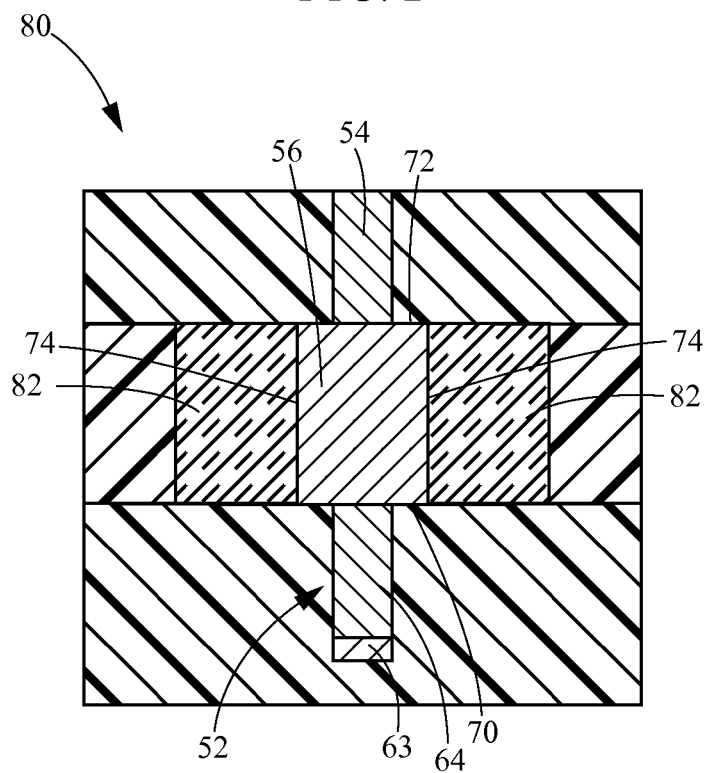
FIG. 3 is a cross-sectional view of a portion of an embodiment of a memory device of the present invention illustrating a single memory cell comprising a phase change material and a thermal expansion material for stressing the phase change material.

FIG. 3 is a cross-sectional view of a portion of another embodiment of a memory device 80 of the present invention. The memory device 80 includes an array of phase change memory cells, only one of which is illustrated in FIG. 3. Each phase change memory cell in the array may be substantially similar to the memory cell previously described with reference to FIG. 2, and may include a first electrode 52, a second electrode 54, and a spatially confined volume of phase change material 56 disposed between the first electrode 52 and the second electrode 54. In some embodiments, the first electrode 52 may comprise a conductive member 63 in electrical contact with a resistive heating element 64 structured to generate heat as current flows through the resistive heating element 64, as previously discussed.

The memory device 80 further includes a thermal expansion material 82 proximate the phase change material 56. The thermal expansion material 82 comprises a material that exhibits a coefficient of thermal expansion that differs from a coefficient of thermal expansion exhibited by the phase change material 56. The thermal expansion material 82 is selected to generate stress within the phase change material 56 upon heating or cooling of the thermal expansion material 82 and the phase change material 56 (e.g., during operation of the memory device 80), as a result of the change in temperature and the difference in thermal expansion coefficients (i.e., thermal expansion mismatch between the thermal expansion material 82 and the phase change material 56).

The thermal expansion material 82 may be disposed laterally beside the phase change material 56. In some embodiments, the thermal expansion material 82 may at least partially surround the lateral side surface 74 of the volume of phase change material 56. For example, the thermal expansion material 82 may entirely laterally surround the volume of phase change material 56. In other words, the thermal expansion material 82 may extend entirely circumferentially around the phase change material 56.

In some embodiments, the thermal expansion mismatch between the thermal expansion material 82 and the phase change material 56 may be sufficient to reduce a magnitude of the activation energy $E_A$ between phases of the phase change material 56 by about 0.05 electron volt (eV) or more.

By way of example and not limitation, the thermal expansion material 82 may exhibit a coefficient of thermal expansion that is at least about one and one-half (1.5) times a maximum coefficient of thermal expansion exhibited by the phase change material 56. As a non-limiting example, the amorphous phase of GeSbTe may exhibit a thermal expansion coefficient of about 13.3 ppm/° K, and the crystalline phase of GeSbTe may exhibit a thermal expansion coefficient of about 17.4 ppm/° K. Thus, in embodiments in which the phase change material 56 comprises GeSbTe, the thermal expansion material 82 may exhibit a thermal expansion coefficient of about 26.1 ppm/° K or more. As a non-limiting example, the thermal expansion material 82 may comprise benzocyclobutene, which exhibits a thermal expansion coefficient of about 42 ppm/° K.

During operation of the memory device 80, electrical current flows through the phase change material 56 from the first electrode 52 to the second electrode 54. The electrical resistance of the resistive heating element 64 generates thermal energy (i.e., heat), some of which is conducted into the phase change material 56 for switching phases thereof. Some of this thermal energy, however, flows laterally outward (in the horizontal direction in the perspective of FIG. 3) away from the resistive heating element 64 and is not conducted into the phase change material 56. This portion of the thermal energy generated by the resistive heating element 64 is essentially wasted in prior art devices. In the memory device 80, however, at least some of this otherwise wasted thermal energy flows into the thermal expansion material 82. As the thermal expansion material 82 is heated by a portion of the thermal energy generated by the resistive heating element 64, the thermal expansion material 82 physically expands at a faster rate than does the phase change material 56. As a result, the phase change material 56 is selectively stressed as the thermal expansion material 82 expands around the phase change material 56. This stress applied to the phase change material 56 may be sufficient to reduce a magnitude of the activation energy $E_A$ between phases of the phase change material 56 in an appreciable manner (e.g., by about 0.05 electron volt (eV) or more).

The strain ($\in$) resulting in the thermal expansion material 82 and in the phase change material 56 resulting from a given change in temperature may be determined using the equation $\in = \alpha \Delta T$, wherein $\alpha$ is the coefficient of thermal expansion and $\Delta T$ is the change in temperature. The magnitude of the stress $\sigma$ within the thermal expansion material 82 and in the phase change material 56 due to the strain $\in$ may be estimated using the equation $\sigma = E\in$, wherein E is the elastic (Young's) modulus, and $\in$ is the strain in a body of material. Thus, the stress $\sigma$ within the phase change material 56 will be a function of a number of variables including the coefficients of thermal expansion $\alpha$ of the phase change material 56 and the thermal expansion material 82, as well as the elastic moduli E of the phase change material 56 and the thermal expansion material 82. Thus, the particular material compositions of the phase change material 56 and the thermal expansion material 82 may be selected to increase (e.g., maximize) the stress within the phase change material 56 relative to that in conventional devices, or otherwise alter an activation energy $E_A$ barrier between phases of the phase change material 56 in a desirable manner.

Figure 4:
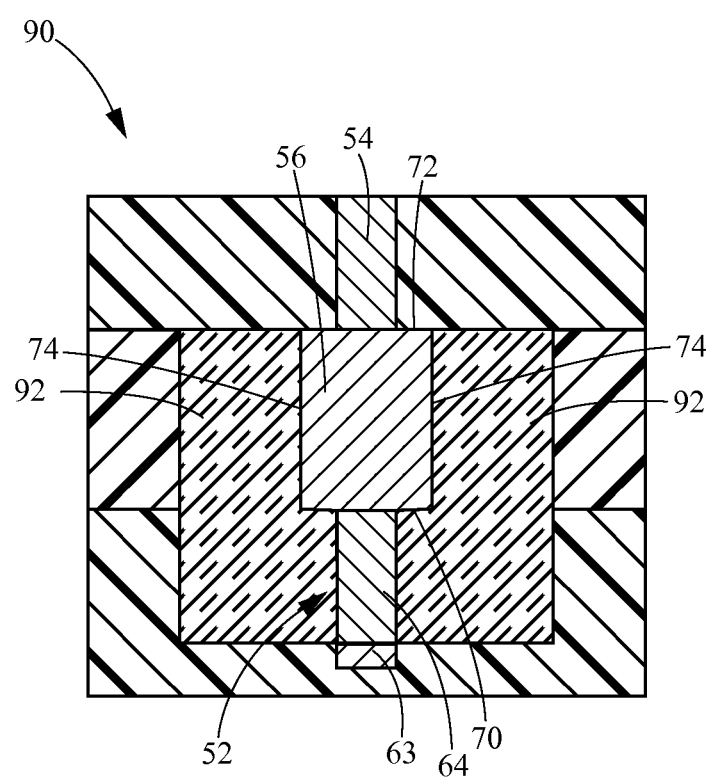
FIG. 4 is a cross-sectional view of a portion of an embodiment of a memory device of the present invention illustrating a single memory cell that also comprises a phase change material and a thermal expansion material for stressing the phase change material.

FIG. 4 is a cross-sectional view of a portion of yet another embodiment of a memory device 90 of the present invention. The memory device 90 of FIG. 4 is substantially similar to the memory device 80 of FIG. 3. The memory device 90, however, includes a thermal expansion material 92 proximate the phase change material 56 that also extends laterally beside (e.g., laterally adjacent) at least a portion of the first electrode 52 (e.g., laterally adjacent at least a portion of the resistive heating element 64). In this configuration, relatively more thermal energy may flow from the first electrode 52 into the thermal expansion material 92 to further increase the thermal expansion of the thermal expansion material 92.

It is noted that embodiments of the present invention may be used to selectively stress phase change material 56 in a phase change memory cell. The programming and reset current of a phase change memory cell can also be reduced by controlling the resistivity of the phase change material 56. In conventional phase change materials, the resistance of the phase change material 56 drops off significantly as the temperature rises. Once the resistance of the phase change material 56 is reduced, the joule heating of the phase change material 56 resulting from the resistivity of the phase change material 56 also is reduced. It is for this reason that the first electrode 52 (the bottom electrode (BEC)) in conventional phase change memory cells includes a resistive heating element 64, the resistance in which provides the joule heating that continues to heat the phase change material 56 after the resistance of the phase change material 56 is decreased. This, however, is a relatively inefficient approach, since the heating of the phase change material 56 is indirectly provided by the resistive heating element 64, and much of the heat generated thereby does not flow into the phase change material 56, as previously discussed. Thus, it would be advantageous to maintain the resistivity of the phase change material 56 at levels high enough to at least primarily (e.g., entirely) heat the phase change material 56 directly by the resistive joule heating of the phase change material 56 itself.

The resistivity of the phase change material 56 may be modulated with mechanical stress. Thus, embodiments of the present invention, which may be used to selectively stress the phase change material in phase change memory cells, also may be used to selectively modulate the resistance of the phase change material 56. Consequently, in accordance with some embodiments of the present invention, the phase change material 56 may be selectively stressed to maintain a resistance in the phase change material 56 above a threshold level during write operations and/or reset operations, to directly heat the phase change material 56 at least primarily by joule heating within the phase change material 56, which may improve the power efficiency of embodiments of memory devices of the present invention relative to previously known memory devices. For example, in some embodiments, the phase change material 56 may be placed under tensile stress to raise a resistance of the phase change material 56 while the phase change material 56 is directly heated by passing current therethrough, after which the phase change material 56 then may be placed under compressive stress to reduce an activation energy $E_A$ barrier between phases of the phase change material 56. Other operational schemes also may be advantageously employed in additional embodiments of the invention.

In view of the above description, some embodiments of the present invention include methods of operating a memory device in which one of a read operation, a write operation, and a reset operation is performed on a memory cell of the memory device while a magnitude of an activation energy barrier between a stable phase and a metastable phase of a phase change material of the memory cell is at a first level, the magnitude of the activation energy barrier is selectively changed from the first level to a second, different level, and another of the read operation, the write operation, and the reset operation is performed while the activation energy barrier is at the second level.

Additional embodiments of the present invention include methods of fabricating memory devices in which a phase change material in at least one memory cell is selectively stressed to alter a magnitude of an activation energy barrier between different phases of the phase change material, and the stress is retained in the phase change material at least until fabrication of the memory device is complete.

Further embodiments of the present invention include memory devices that include a phase change memory cell and a material, structure, or device for selectively stressing phase change material in the memory cell. For example, a memory device may include a piezoelectric device having a piezoelectric material located, and a crystalline structure of the piezoelectric material oriented, to cause the piezoelectric material to apply stress to the phase change material when an electrical field is provided within the piezoelectric material. The piezoelectric device may also comprise a field-generating device for providing an electrical field within the piezoelectric material. As another example, a memory device may include a thermal expansion material at least partially surrounding the phase change material in a phase change memory cell. The thermal expansion material has a coefficient of thermal expansion differing from a coefficient of thermal expansion of the phase change material. The thermal expansion material may be selected to generate stress within the phase change material upon heating or cooling of the thermal expansion material and the phase change material during operation of the memory device.

Additional embodiments of the present invention include methods of operating a phase change memory device in which a phase change material in at least one phase change memory cell is selectively stressed to maintain a resistance of the phase change material above a threshold level, and current is passed through the phase change material while maintaining the resistance of the phase change material above the threshold level to directly heat the phase change material at least primarily by joule heating within the phase change material.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from scope of the invention as defined by the claims that follow, and their legal equivalents.

What is claimed is:

1. A method of fabricating a memory device, comprising:
    selectively stressing a phase change material in at least one memory cell of a partially fabricated semiconductor device to reduce a magnitude of an activation energy barrier between different phases of the phase change material, comprising:
        inducing strain in a piezoelectric material using an electric field to expand or contract the piezoelectric material in a direction; and
        using the induced strain in the piezoelectric material to stress the phase change material;
    completing fabrication of the memory device; and
    retaining the stress in the phase change material at least until fabrication of the memory device is complete.

2. The method of claim 1, wherein selectively stressing the phase change material comprises stressing the phase change material to a stress of about 100 MPa or more.

3. The method of claim 1, wherein selectively stressing the phase change material comprises reducing the magnitude of the activation energy barrier by about 0.05 eV or more.

4. The method of claim 1, further comprising selecting the phase change material to comprise GeSbTe.

5. The method of claim 1, wherein selectively stressing the phase change material comprises reducing the magnitude of the activation energy barrier.

6. The method of claim 1, further comprising selecting the piezoelectric material from the group consisting of quartz, gallium orthophosphate ($GaPO_4$), barium titanate ($BaTiO_3$), lead titanate ($PbTiO_3$), lead zirconate titanate (PZT) ($Pb[Zr_xTi_{1-x}]O_3$, wherein $0<x<1$), and lithium tantalate ($LiTaO_3$).

7. The method of claim 1, further comprising disposing the piezoelectric material laterally beside the phase change material.

8. The method of claim 7, wherein the piezoelectric material has a crystal structure oriented such that, when an electrical field is provided within the piezoelectric material, the piezoelectric material expands or contracts in the lateral direction.

9. The method of claim 1, further comprising providing a dielectric material between the piezoelectric material and the phase change material, the dielectric material physically isolating the piezoelectric material from the phase change material.

10. A method of fabricating a memory device, comprising:
    selectively stressing a phase change material in at least one memory cell of a partially fabricated semiconductor device to reduce a magnitude of an activation energy barrier between different phases of the phase change material, the selectively stressing comprising:
        selecting a thermal expansion material comprising benzocyclobutene;
        inducing strain in the thermal expansion material by at least one of heating and cooling the thermal expansion material; and
        using the induced strain in the thermal expansion material to stress the phase change material;
    completing fabrication of the memory device; and
    retaining the stress in the phase change material at least until fabrication of the memory device is complete.

11. The method of claim 10, further comprising selecting the thermal expansion material to exhibit a coefficient of thermal expansion that is at least about one and one-half (1.5) times a maximum coefficient of thermal expansion exhibited by the phase change material.

12. The method of claim 10, further comprising disposing the thermal expansion material laterally adjacent the phase change material.

* * * * *